United States Patent [19]
Chandross et al.

[11] Patent Number: 5,741,629
[45] Date of Patent: Apr. 21, 1998

[54] RESIST MATERIALS AND RELATED PROCESSES

[75] Inventors: Edwin Arthur Chandross, Murray Hill; Janet Mihoko Kometani, Warren; Omkaram Nalamasu, Basking Ridge; Elsa Reichmanis, Westfield, all of N.J.; Kathryn Elizabeth Uhrich, Boston, Mass.

[73] Assignee: Lucent Technologies Inc., Murray Hill, N.J.

[21] Appl. No.: 730,560

[22] Filed: Oct. 15, 1996

Related U.S. Application Data

[63] Continuation of Ser. No. 148,706, Nov. 8, 1993, abandoned.
[51] Int. Cl.$^6$ ............................................. G03C 5/00
[52] U.S. Cl. ..................... 430/326; 430/325; 430/270.1
[58] Field of Search ................................. 430/325, 270.1, 430/326

[56] References Cited

U.S. PATENT DOCUMENTS

| | | | |
|---|---|---|---|
| 4,808,511 | 2/1989 | Holmes | 430/325 |
| 4,996,136 | 2/1991 | Houlihan et al. | 430/326 |

FOREIGN PATENT DOCUMENTS

| | | |
|---|---|---|
| A-0 366 590 | 5/1990 | European Pat. Off. |
| A-0 524 759 | 1/1993 | European Pat. Off. |

OTHER PUBLICATIONS

Takumi Ueno et al. "Chemical amplification positive resist Systems using novel Sulfonates as acid generators," Polym. Microelectron. Proc. Int. Symp. (1990). Meeting date 1989, pp. 413–424.

Hiroshi Ito et al. "Effects of polymer end groups on Chemical amplification", SPIE vol. 1672 Advances in Resist Technology and Processing, Mar. 9–10, 1992, pp. 1–14.

*Primary Examiner*—George F. Lesmes
*Assistant Examiner*—Laura Weiner
*Attorney, Agent, or Firm*—Bruce S. Schneider

[57] ABSTRACT

Polymers suitable for chemically amplified resists based on styrene chemistry are advantageously formed with a meta substituent on the phenyl ring of the styrene moiety. Additionally, polymers for such applications including, but not limited to, meta substituted polymers are advantageously formed by reacting a first monomer having a first protective group with a second monomer having a second protective group. After polymerization, the second protective group is removed without substantially affecting the first protective group. For example, if the first protective group is an alkoxy carbonyl group, and the second protective group is a silyl ether group, treatment with a lower alcohol with trace amounts of acid transforms the silyl group into an OH-moiety without affecting the alkoxy carbonyl group.

8 Claims, No Drawings

RESIST MATERIALS AND RELATED PROCESSES

This is a continuation of application Ser. No. 08/148,706, filed on Nov. 8, 1993, now abandoned.

BACKGROUND OF THE INVENTION

1. Field of the Invention

This invention relates to lithographic processes, and in particular, to lithographic processes involving device fabrication.

2. Art Background

Lithographic processes are typically employed in the manufacture of devices such as semiconductor devices. That is, a material, i.e., a resist, that is sensitive to the exposing radiation is coated onto a substrate, e.g., a silicon wafer that is being processed to form a plurality of devices. The coating material is (if desired) baked, subjected to spatially discrete radiation, e.g., light that has been passed through a mask material, or a controlled particle (e.g., electron) beam, so that the radiation reaching the resist corresponds to a desired pattern that is to be transferred into the underlying substrate, and then, if desired, post-exposure baked before development of the pattern.

Resist materials, including a polymer having a protective group, have been described in U.S. Pat. No. 4,812,542, dated Mar. 14, 1989. The protective group present in these materials is employed in the synthesis process to prevent undesired reactions during formation of the resist material. Such protective groups, since they are not involved in the operation of the resist, are removed before or after exposure throughout the resist material by heating. Thus, for example, in a synthesized polymer, such as poly(4-tert-butoxycarbonyloxystyrene-co-o-nitro-α-methylbenzyl methacrylate), the tert-butoxycarbonyl protective group is removed to leave a hydroxyl substituent. This substituent then performs the function of providing an acid moiety that after exposure and bake provides alkaline solubility to the exposed regions. The protective group, however, is not involved in producing the desired pattern.

Among the lithographic processes that are available to expose resists having protective groups, photolithography is often utilized. Photolithographic processes have the advantage of being suitable for a blanket exposure technique, i.e., the entire wafer is exposed simultaneously. A blanket exposure is advantageous because it is relatively fast compared to other methods such as the raster scan technique usually employed when the energy used to expose the resist is a beam of electrons. However, generally, resolution obtainable through a blanket exposure with near ultraviolet or visible light is somewhat poorer than that achieved with other methods such as electron lithography.

Improved resolution with a blanket exposure is achievable by using deep ultraviolet or X-ray light. X-ray exposure generally has a potential for better resolution than exposure with deep ultraviolet light, but has not been studied as extensively. One approach to a photoresist sensitive to deep ultraviolet radiation employs a compound that produces an acid moiety upon irradiation together with a polymer that reacts under the influence of heat with the generated acid. This reaction is often through a protective group that is involved in the lithographic process and that is removed from the polymer leaving a moiety such as a hydroxyl or carboxylic acid group that promotes aqueous base solubility.

Typical acid generator/acid sensitive polymer combinations include an onium salt as the photosensitive acid generator and a polymer such as poly(4-t-butoxycarbonyloxystyrene) that has a reactive substituent, e.g., a t-butoxycarbonyl protective group. (See Ito, et al, U.S. Pat. No. 4,491,628, dated Jan. 1, 1985.) Other chemically amplified resists including disulfone acid generators are described in European Patent Publication 0520265AZ. Such systems are generally referred to as chemical amplification systems since the production of one molecule of acid by actinic radiation induces a reaction in a plurality of molecules in the acid sensitive polymer.

Attempts have been made to improve the characteristics of chemically amplified resists. The tert-butoxycarbonyl (t-BOC) leaving groups have been used in materials such as described in Canadian Patent Application 2,001,384. In this patent application, a polymer containing the t-BOC group is solvated and the solution treated by addition of acid with heating to remove a portion of these groups. Acid is removed from the resulting partially deprotected polymer, the polymer is then isolated, a photoacid generator is added with a spinning solvent to the polymer, and then this combination is employed to coat the substrate which is subsequently exposed. This procedure is not desirable because it requires an additional reaction after synthesis and a meticulous removal of acid before coating.

To enhance the performance of acid generator/polymer combinations, another proposal employs a polymer including both a substituent sensitive to acid and a moiety present in the polymer chain that induces upon irradiation chain scission with associated decrease in molecular weight. As described by R. G. Tarascon, et al., *Proceedings of Regional Technical Conference on Photopolymers, Principles, Processes and Materials,* Mid Hudson Section, Society of Plastic Engineers, Oct. 30 to Nov. 2, 1988, Ellenville, N.Y., page 11 and R. G. Tarascon, et al., *Polymer Engineering and Science,* 29, 850 (1989), one such combination includes an acid generator and a polymer having a sulfone moiety in the backbone.

Although chemically amplified resists, such as those involving poly(4-t-butoxycarbonyloxystyrene), show great promise for fine line exposure, these materials have demonstrated a tendency to shrink upon exposure and post-exposure baking. Such shrinking produces a loss of image quality and, in part, counteracts resolution improvement available through use of ultraviolet, X-ray, or electron beam exposure. Thus, although chemically amplified resists are extremely promising, some improvement is desirable.

SUMMARY OF THE INVENTION

As discussed in copending U.S. patent application Ser. No. 07/734,423 now abandoned (Novembre 9), (which is hereby incorporated by reference), partially deprotected chemically amplified resists reduce the shrinking associated with protected polymers. As further discussed in U.S. patent application Ser. No. 08/008,029, now abandoned dated Jan. 25, 1993 (Bohrer-Mixon 4-2), a viable approach for deprotection involves the thermal processing of a resist having protective groups. In accordance with this invention, another approach is possible which does not rely on partial deprotection of a single protecting group. Instead, at least two protective groups are employed with the concentration of the first protective group equivalent to its desired concentration such as employed in the previously described partially deprotected resists. This approach employs a first protective group that is to remain in the polymer during exposure, and a second protective group that is removed after polymer synthesis to yield a polymer having both protective groups and OH-moieties. For example, monomers including a first protective group such as tert-butoxycarbonyl, t-butyl, or t-amyloxycarbonyl are copolymerized with a monomer having a second protective group such as a silyl ether group. The second protective group is chosen so that it is removed in a suitable medium that does not affect the first protective group. In the case of a first protective group such as a 4-t-butoxycarbonyloxy group, and a second protective group such as a silyl ether group, the latter is removed by treatment in an alcohol such as methanol having a trace amount (less than 0.1 wt %) of HCl, while the former is essentially unaffected by this treatment. (In sulfone copolymers, sufficient $SO_2$ is invariably left after synthesis so that trace HCl is unnecessary.)

Thus, the two monomers are polymerized alone or with other monomers such as $SO_2$ or methyl maleimide. (See Galvin-Donoghue-Reichmanis 1–20 which has been filed concurrently herewith and is hereby incorporated by reference.) The resulting polymer is treated in a suitable medium such as acidic methanol resulting in a polymer having the first protective groups and OH-groups corresponding to the originally present second protective group. The resulting polymer is equivalent to one having a single protective moiety that has been partially deprotected. The ratio of protective groups to OH groups in the final polymer is determined by adjusting the relative stoichiometry of the reacting monomers. By the same process, corresponding terpolymers and higher polymers are producible. (Use of a third or additional protective moieties is not precluded.)

Additionally, it has been found that resists based on styrene monomers having a meta substituent to the vinyl group have substantially enhanced adhesion and optical absorption properties relative to the corresponding para entity. Suitable meta substituted styrene polymers are producible using the previously described dual protective group procedure.

DETAILED DESCRIPTION

The procedure described for processing a resist during the fabrication of a device is conventional except for the treatment employed to remove protective groups after formation of the resist on the device substrate. Thus, for example, conventional exposure and development techniques, such as described in L. F. Thomson, et al., *Introduction to Microlithography*, ACS Symposium Series 219, American Chemical Society, Washington, D.C., (1983), pages 199–210, are suitable. Additionally, substrate coating techniques such as spinning, as described in Thompson, supra, page 186, are also advantageously employed. Exposing radiation, such as X-rays, deep ultraviolet radiation, and charge particle beams, such as electron beams, are suitable. The resist material, after exposure and development, is employed for subsequent device processing. For example, the resist overlies a metal layer which is etched to produce a pattern in the metal corresponding to that in the resist. Alternatively, a metal is deposited onto a substrate having a patterned resist and the resist removed to leave behind the deposited metal in the desired pattern. Alternatively, the resist is used as an ion implantation mask.

In one embodiment, the resist materials involved in the invention include a polymer having meta substituents on the phenyl ring of a polymer formed from a substituted styrene monomer. In another embodiment, para or mixed para and meta substituted polymers are used. The meta substituted resist or other resists having substituents in the para position or mixed meta and para positions are prepared by a technique employing two chemically different protective groups. Copolymerization of substituted styrenes together, and with other monomers is well known and is extensively described in a compendium such as *Polymer Synthesis, Vol.* 1, Stanley R. Sandler, et al., Academic Press, New York, N.Y. (1974). The choice of substituent depends on the properties desirable for the resist. Desirable resist properties are fully discussed in U.S. Pat. No. 4,996,136, dated Feb. 26, 1991 (Houlihan 2-14-24), which is hereby incorporated by reference. However, generally, substituents such as t-butoxycarbonyl, acetoxy, and hydroxy lead to useful polymeric materials for resist applications.

The two protective groups are introduced in separate monomers which are copolymerized or are present on individual substituted monomers that are copolymerized. (Additionally, it is possible to employ more than two monomers.) As discussed, conventional techniques such as free radical polymerization are available for accomplishing the desired polymerization.

After polymerization but before pattern exposure to radiation, all or a substantial fraction of the second protective group is removed. This removal is accomplished by employing a reactant that substantially reacts with the second protective group without substantially affecting the first protective group. That is, it is desirable that under the reaction conditions employed for removal of the second protective group, between 90 and 100% of such group is removed while less than 1% of the first protective group is affected.

Typical of first protective groups are t-butoxycarbonyl, t-butyl, and t-amyloxycarbonyl. These groups are chosen to produce in the presence of acid, a carbonium ion that is sufficiently stable to allow the elimination of an $\alpha$-hydrogen, and yet will remain substantially unaffected in the presence of a dilute, non-nucleophilic acid such as HCl. However, this test is not exhaustive and the specific first protective group employed is not limited provided reaction as previously discussed is possible. Typical substituents for the second protective group include trimethylsilyl, triethylsilyl, dimethylethylsilyl, dimethylpropylsilyl, dimethylisopropylsilyl, and dimethyl-t-butylsilyl. Again, choice of the second protective groups is not limited provided the desired reaction rate as discussed above of the second protective group relative to the first protective group is possible.

Generally, it is desirable to choose a second protective group that undergoes relatively simple reactions such as acid hydrolysis. For example, the use of a silyl group allows the interaction with a lower alkyl alcohol such as methanol (in the trace presence of an acid and moisture) to remove the silyl protective group and to yield an OH substituent. The removal of the first group is usually performed during exposure and development of a resist including the polymer. Lithographic exposure and development conditions are described in U.S. Pat. No. 4,996,136 supra.

The following examples are illustrative of the invention.

EXAMPLE 1

For reaction, 4-vinylphenyl acetate was obtained from Hoechst-Celanese, 4-tert-butoxycarbonyloxystyrene was obtained from Kodak, and each was used as received. Additionally anhydrous sulfur dioxide ($SO_2$) was obtained from Matheson Gas Products, azoisobutyronitrile (AIBN) was obtained from Alfa Chemical Company. Phenylcumyldisulfone, bis(2-nitro-6-trifluoromethylbenzyl) 1,3-benzenedisulfonate and poly(p-acetoxystyrene-co-p- tert-butoxycarbonyloxystyrene-co-sulfone) (with an acetoxystyrene to tert-butoxycarbonyloxystyrene ratio of 40:60 and a total styrenes to sulfone ratio of 2.8:1), were obtained from OCG Microelectronic Materials, Inc. Potassium carbonate, cesium carbonate, and methyltriphenylphosphonium bromide were dried under vacuum over phosphorus pentoxide at 100° C. Tetrahydrofuran (THF) was distilled from sodium and benzophenone.

Characterization of products was performed by $^1$H and $^{13}$C NMR spectroscopy and were recorded on solutions in $CDCl_3$ or $CD_3OD$ as indicated on a Brüker AM360 spectrometer using the solvent proton signal as reference. Fourier transform infrared spectrometry (FTIR) was performed on a Mattson Instruments Galaxy Series 8020 FTIR spectrometer in dual-beam mode using double-polished silicon wafers or KBr disks. Ultraviolet spectroscopy was performed on a Hewlett-Packard 8452A Diode Array spectrophotometer on thin films of the polymers obtained from polymer/ethyl ethoxypropionate (EEP) (15 wt %) solution spun onto quartz disks. The film thicknesses of the UV samples were measured by a Sloan Dektak 3030 surface measuring system.

Analytical thin layer chromatography (TLC) was performed on commercial Merck plates coated with silica gel GF254 (0.25 mm thick). Size exclusion chromatography (SEC) was performed with a Waters Model 510 pump in conjunction with a Waters Model 410 differential refractometer detector and a Viscotek Model 100 differential viscometer detector. A set of Polymer Laboratories DL-gel, 5 µm particle size MIXC pore-type columns were used with tetrahydrofuran as the eluting solvent. Data acquisition and analysis were performed by an AT&T 6312 microcomputer equipped with an ASYST Unical software system. The molecular weight data are reported relative to a universal calibration curve generated from narrow molecular weight, linear polystyrene standards (Polymer Laboratories).

Thermal analysis data were obtained using a Perkin-Elmer TGA-7 thermogravimetric analyzer interfaced with a TAC 7 thermal analysis controller and a PE-7700 data station. TGA samples were heated at a rate of 10° C./minute with a purified $N_2$ gas flow of 20 $cm^3$/min. DSC samples were heated at a rate of 10° C./minute. Elemental analyses (C, H, S and Si) were determined by Robertson Microlit Laboratories Inc., Madison, N.J.

Acetyl chloride (25.0 ml, 0.35 mole) was added dropwise to an ice-chilled solution of 3-hydroxybenzaldehyde (36.1 g, 0.30 mole) and triethylamine (50.0 ml, 0.36 mole) in methylene chloride (50 ml). After one hour, the mixture was warmed to room temperature and allowed to react overnight (~12 hours). The reaction mixture was diluted with methylene chloride, washed two times with water, followed by two washings in 1 N HCl, two washings in water, a washing in brine, drying over $MgSO_4$, and subsequent evaporation to dryness. The resulting 3-acetoxybenzaldehyde product was purified by flash chromatography, eluting with 2:1 methylene chloride/hexane to obtain 42.2 g of the material as a yellow oil (87% yield). $^1$H NMR δ 2.30 (s, 3H, $COCH_3$), 7.22 (q, 1H, ArH), 7.31 (q, 1H, ArH), 7.52 (t, 1H, ArH), 7.59 (s, 1H, ArH), 9.96 (s, 1H, CHO). $^{13}$C NMR δ 20.9 ($CH_3$), 122.1, 127.1, 127.6, 130.0 (ArCH), 137.6, 151.1 (ArC), 169.0 ($COCH_3$), 191.0 (CHO).

For synthesis of 3-acetoxystyrene, all glassware was dried in an oven overnight and assembled while still warm. Methyltriphenylphosphonium bromide (47.9 g, 0.134 mole) and cesium carbonate (47.6 g, 0.146 mole) in dimethylformamide (350 ml) was heated to 50° C. for one hour until a bright yellow color was obtained. 3-Acetoxybenzaldehyde (20.0 g, 0.122 mole) in dimethylformamide (100 ml) was added dropwise to the heated solution. After 70 hours, the reaction mixture was cooled to room temperature and poured over ice. The product was extracted with hexane in the presence of t-butylcatechol (0.1 g). The organic solution was washed with brine, dried over $MgSO_4$, and evaporated to dryness. The product was purified by flash chromatography, eluting with 3:1 hexane/methylene chloride to obtain 11.0 g of 3-acetoxystyrene as a pale yellow oil (55% yield). $^1$H NMR δ 2.21 (s, 3H, $CH_3$), 5.24 (d, 1H, CH), 5.65 (d, 1H, CH), 6.67 (q, 1H, CH), 6.93 (d, 1H, ArH), 7.15 (s, 1H, ArH), 7.25 (m, 2H, ArH). $^{13}$C NMR δ 20.4 ($CH_3$), 114.4 ($CH_2$), 118.7, 120.5, 123.3, 129.0 (ArCH), 135.6 (CH), 138.8, 150.7 (ArC), 168.7 (C=O).

To synthesize 3-t-butoxycarbonyloxybenzaldehyde, 3-hydroxybenzaldehyde (55.9 g, 0.458 mole), potassium carbonate (126 g, 0.916 mole) and 18-crown-6 (1.20 g, 4.54 mmol) were stirred in tetrahydrofuran (200 ml) until the 3-hydroxybenzaldehyde was dissolved. The reaction mixture was then set in an ice bath. Di-t-butyl dicarbonate (100 g, 0.458 mole) in tetrahydrofuran (75 ml) was added dropwise to the reaction mixture. After one hour at 0° C., the reaction mixture was warmed to room temperature and allowed to react further (approximately 12 hours). The solution was decanted from the excess potassium carbonate and then evaporated to dryness. The reaction mixture was redissolved in methylene chloride, washed four times with water, washed one time in brine, dried over $MgSO_4$, and evaporated to dryness to obtain 100 g of 3-t-butoxycarbonyloxybenzaldehyde as a brown oil (98% yield). $^1$H NMR δ 1.56 (s, 9H, $CH_3$), 7.42 (m, 1H, ArH), 7.53 (t, 1H, ArH), 7.72 (m, 2H, ArH), 9.98 (s, 1H, CHO). $^{13}$C NMR δ 27.4 (C—$CH_3$), 83.8 (C—$CH_3$), 121.6, 126.9, 127.1, 129.9 (Ar CH), 137.5, 151.4 (ArC), 190.8 (CHO).

To synthesize 3-t-butoxycarbonyloxystyrene, 3-t-butoxycarbonyloxybenzaldehyde (21.3 g, 95.8 mmol) in tetrahydrofuran (100 ml) was added dropwise to a slurry of methyltriphenylphosphonium bromide (34.1 g, 95.6 mmol) and potassium t-butoxide (10.7 g, 95.6 mmol) in tetrahydrofuran (350 ml). After four hours, the reaction mixture was poured over ice and diluted with ethyl acetate (500 ml). The organic portion was washed twice with water, once in brine, dried over $MgSO_4$ and evaporated to dryness. The product was purified by flash chromatography, eluting with 2:1 hexane/methylene chloride to obtain 11.3 g of 3-tert-butoxycarbonyloxystyrene as a pale yellow oil (54%). $^1$H NMR δ 1.60 (s, 9H, $CH_3$), 5.31 (dd, 1H, $CH_2$), 5.79 (dd, 1H, $CH_2$), 6.73 (dd, 1H, CH), 7.10 (m, 1H, ArH), 7.31 (m, 3H, ArH). $^{13}$C NMR δ 27.6 ($CH_3$), 83.4 (C—$CH_3$), 114.9 ($CH_2$), 118.7, 120.5, 123.7, 129.3 (ArCH), 135.9 (CH), 139.2, 151.3 (ArC).

To synthesize 3-hydroxystyrene, 3-acetoxystyrene (14 g, 84 mmol) was added dropwise to ice-chilled ammonium hydroxide (14 ml). After 1.5 hours, water (150 ml) was added and carbon dioxide was bubbled through for eight hours until the reaction mixture was at a neutral pH. The reaction mixture was extracted with ethyl acetate and the organic portion washed once with water, once with brine, dried over $MgSO_4$, and evaporated to obtain 10 g of 3-hydroxystyrene as an orange oil (99% yield). $^1$H NMR ($CD_3OD$) δ 5.0 (br, OH), 5.18 (d, 1H, $CH_2$), 5.72 (d, 1H, $CH_2$), 6.60 (m, 1H, CH), 6.76 (d, 1H, ArH), 6.90 (d, 1H, ArH), 6.94 (s, 1H, ArH), 7.13 (t, 1H, ArH). $^{13}$C NMR ($CD_3OD$) δ 113.5 (ArCH), 113.8 ($CH_2$), 115.6, 118.8, 130.4 (ArCH), 137.9 (CH), 140.1, 158.2 (ArC).

To synthesize 3-trimethylsilyloxystyrene, hexamethyldisiloxane (25 ml, 120 mmol) was added to 3-hydroxystyrene (10 g, 83 mmol) set in an ice bath. After 30 minutes, the reaction mixture was warmed to room temperature and allowed to react for another 21 hours. The white precipitate was filtered off, the excess hexamethyldisiloxane removed under vacuum, and the product purified by distillation (40° C./0.05 mm Hg) to obtain 13 g of 3-trimethylsilyloxystyrene as a clear oil (73% yield). $^1$H NMR δ 0.20 (s, 9H, SiCH$_3$), 5.15 (d, 1H, CH$_2$), 5.63 (d, 1H, CH$_2$), 6.58 (dd, 1H, CH), 6.69 (t, 1H, ArH), 6.84 (s, 1H, ArH), 6.94 (d, 1H, ArH), 7.10 (t, 1H, ArH). $^{13}$C NMR δ 2.5 (SiCH$_3$), 113.9 (CH$_2$), 117.7, 119.5, 119.7, 129.4 (ArCH), 136.7 (CH), 139.1, 155.4 (AR C).

4-Trimethylsilyloxystyrene was prepared as described for the 3-trimethylsilyloxystyrene analog.

For each sulfone-containing polymer synthesized, a mixture of AIBN and toluene in a modified Kjeldahl reactor flask was placed in a −75° C. bath and the flask evacuated. The degassed styrene monomers were transferred under vacuum into the reactor flask. The ratio of AIBN to styrene monomer was 1:50. The styrene monomer volume was equivalent to the total volume of SO$_2$ and toluene, and the molar feed ratio of styrene monomer to SO$_2$ was 1:1.25. SO$_2$ was distilled into a graduated flask at −75° C., degassed by a freeze/thaw method, and then distilled into the reactor. The reactor flask was sealed and placed into a 65° C. bath. After several hours, the flask was cooled to room temperature and the excess SO$_2$ removed under vacuum while stirring. Acetone was added and the polymer was isolated by precipitation of the reaction mixture into methanol. The polymer was purified by redissolution into acetone followed by precipitation into methanol (2×) or petroleum ether (2×). The purified polymer was placed in a vacuum oven overnight at room temperature. The ratio of total styrenes to sulfone was ~2.8:1 unless otherwise noted.

Poly(3-acetoxystyrene-co-4-tert-butoxycarbonyloxystyrene-co-sulfone) was made by this general polymerization procedure, was obtained in 47% yield after four hours, and was purified by precipitation into methanol. The ratio of acetoxystyrene to tert-butoxycarbonyloxystyrene was 40:60. GPC: M$_w$=77,200; M$_n$=50,400; D=1.5; IV=0.30. Anal. Calc: C, 64.9; H, 6.2; S, 4.89; Found: C, 64.4; H, 6.20; S, 4.76. OD$_{248}$ (EEP): 0.13 AU/μm. BOC deprotection: onset 162° C. (27% weight loss). Decomposition: onset 205° C. T$_g$: 142° C. $^1$H NMR δ 1.54 (C—CH$_3$), 2.26 (COCH$_3$), 1.3–3.9 (CH, CH$_2$) and 6.1–7.4 (ArH).

Poly(3-acetoxystyrene-co-4-tert-butoxycarbonyloxystyrene-co-4-hydroxystyrene-co-sulfone) was obtained by the above-described procedure in 25% yield after a reaction time of 10 hours and purified by precipitation into petroleum ether. The ratio of acetoxystyrene to tert-butoxycarbonyloxystyrene to hydroxystyrene was 40:35:25. Anal. Calc: C, 65.5; H, 6.0; S, 5.5; Found: C, 64.7; H, 6.11; S, 5.52. OD$_{248}$ (EEP): 0.30 AU/μm. BOC deprotection: onset 157° C. (21% weight loss). Decomposition: onset 232° C. T$_g$: 192° C. $^1$H NMR δ 1.54 (C—CH$_3$), 2.26 (COCH$_3$), 1.3–3.9 (CH, CH$_2$) and 6.1–7.4 (ArH).

Poly(3-acetoxystyrene-co-4-tert-butoxycarbonyloxystyrene-co-3-hydroxystyrene-co-sulfone) was obtained by the above-described procedure in 32% yield after a reaction time of 10 hours and purified by precipitation into petroleum either. The ratio of acetoxystyrene to tert-butoxycarbonyloxystyrene to hydroxystyrene was 40:35:25. Anal. Found: C, 66.3; H, 6.73; S, 4.80. OD$_{248}$ (EEP): 0.19 AU/μm. BOC deprotection: 148° C. (22% weight loss). Decomposition: 233° C. T$_g$: 169° C. $^1$H NMR δ 1.54 (C—CH$_3$), 2.26 (COCH$_3$), 1.3–3.9 (CH, CH$_2$) and 6.1–7.4 (ArH).

Poly(4-acetoxystyrene-co-4-tert-butoxycarbonyloxystyrene-co-4-hydroxystyrene-co-sulfone) was obtained by the above-described procedure in 39% yield after a reaction time of 9.5 hours and purified by precipitation into methanol. The ratio of acetoxystyrene to tert-butoxycarbonyloxystyrene to hydroxystyrene was 40:35:25. Anal. found: C, 63.0; H, 5.67; S, 6.35. OD$_{248}$ (EEP): 0.39 AU/μm. BOC deprotection: 154° C. (17% weight loss). Decomposition: 230° C. T$_g$: 177° C. $^1$H NMR δ 1.56 (C—CH$_3$), 2.29 (COCH$_3$), 1.6–3.3 (CH, CH$_2$), 6.3–7.2 (ArH).

For the styrene copolymers, a mixture of AIBN and toluene in a modified Kjeldahl reactor flask was placed in a −75° C. bath and the flask evacuated. The degassed styrene monomers were transferred under vacuum into the reactor flask. The ratio of AIBN to styrene monomer was 1:50, and the volume of toluene was equal to the volume of the continued styrene monomers. The reactor flask was sealed off and placed into a 65° C. bath. After 4–8 hours, the flask was cooled to room temperature and acetone added. The polymer was simultaneously isolated and deprotected by precipitation of the reaction mixture into acidic methanol (0.5 ml HCl in 3500 ml methanol). The polymer was purified by redissolution into acetone followed by precipitation into petroleum ether (2×). The purified polymer was placed in a vacuum oven overnight at room temperature. Poly(3-hydroxystyrene-4-t-butoxycarbonyloxystyrene) (P(3HS-4TBS)) having a 3HS to 4TBS ratio of 3:1 was prepared in 29% yield. Anal. Calc.: C, 76:6; H, 6.90. Found: C, 76.2; H, 71.8. GPC: M$_w$=68,300; M$_n$=53,500; D=1.3; IV=0.23. OD: 0.17 AU/μm. Yield: 29% as a white solid.

Poly (3HS-co-4-TBS) having a 3HS to 4TBS ratio of 1:1 was prepared in 56% yield. Anal. Calc.: C, 74.1; H, 7.06. Found: C, 75.2; H, 7.46. GPC: M$_w$=64,500; M$_n$=49,000; D=1.3; IV=0.21. OD: 0.14 AU/μm.

Poly(3HS-co-4TBS) having a 3HS to 4TBS ratio of 1:3 was obtained in 54% yeild. Anal. Calc.: C, 72.3; H, 7.20. Found: C, 71.8; H, 7.37. GPC: M$_w$=75,500; M$_n$=46,000; D=1.6; IV=0.21. 0.10 AU/μm.

EXAMPLE 2

To prepare resist materials, solutions were made by dissolving a photoacid generator (either 15 wt % of bis(2-nitro-6-trifluoromethylbenzyl) 1,3-benzenedisulfonate, or 3 wt % of phenylcumyldisulfone relative to the weight of the polymer) in a solution of the matrix polymer (15 wt/vol %) in ethyl ethoxypropionate (EEP) or propyleneglycolmonomethylether acetate. The solutions were spin-coated onto hexamethyldisilazane (HMDS) primed 4" silicon substrates and baked at 120° C. for 30 seconds. The resist coated substrates were then, in turn, coated with aproximately 600 Å of a Deep U.V. resist overcoat sold by OCG Microelectronics Materials, Inc., which is basically a methyl methacrylate-methacrylic acid copolymer. This was accomplished by spin coating at approximately 3000 rpm for 60 seconds followed by baking at 105° C. for 60 seconds. The resist-coated substrates were then exposed by a Süss Model MA56A contact aligner equipped with a Lambda Physik excimer laser operating at 248 nm or a GCA-XLS Laser-Step® deep UV exposure tool operating at 248 nm and equipped with 0.48 NA optics. After exposure, the substrates were baked at 120° C. for 1 minute. The developer solution was tetramethylammonium hydroxide (TMAH) (25% in water) diluted further in water. The ratio of TMAH solution to water varied from 1:10 to 1:9. The exposed and baked films were developed in the aqueous base solution for 15–120 seconds. Film thickness was measured on a Nanospec film thickness gauge (Nanometrics, Inc.). Resolution and image quality were determined by examining developed patterns with a JEOL Model 35 CFS scanning electron microscope. The results of these evaluations are presented in Table 1.

| Polymer | Contrast | Resist Film Thickness Loss Upon PEB (%) | Lithographic Sensitivity | | PED Latitude |
| --- | --- | --- | --- | --- | --- |
| | | | Clearing Dose | 0.5 μm Resolution Dose mJ/cm$^2$ | |
| poly(4-acetoxystyrene-co-4-tert-butoxycarbonyloxystyrene-co-sulfone)[a,b] | >10 | 20 | 16 | 50 | <15 min. |
| poly(3-acetoxystyrene-co-4-tert butoxycarbonyloxystyrene-co-sulfone)[a,b] | >10 | 20 | 32 | 90 | >15 min. |
| poly(4-acetoxystyrene-co-4-tert-butoxycarbonyloxystyrene-co-3-hydroxystyrene-co-sulfone)[b] | >10 | 11 | 60 | 135 | >15 min. |
| poly(3-acetoxystyrene-co-4-tert-butoxycarbonyloxystyrene-co-3-hydroxystyrene-co-sulfone)[b] | >10 | 11 | 45 | 99 | >15 min. |
| poly(4-acetoxystyrene-co-4-tert-butoxycarbonyloxystyrene-co-4-hydroxystyrene-co-sulfone)[b] | >10 | 11 | 12 | 30 | <15 min. |

[a]The PAG used in this study was bis(-2-nitro-6-trifluoromethylbenzyl)-1,3-benzene disulfonate.
[b]Lithographic evaluation was conducted utilizing a barrier covercoat for Deep U.V. resists sold by OCG Microelectronic Materials, Inc.

We claim:

1. A process for fabricating a device comprising the steps of 1) providing on a device substrate a region of a polymer, a) said polymer having a multiplicity of first substituents with chemical protection where said protection comprises a first protective group bound to said first substituent, and b) having a multiplicity of unprotected second substituents such that said unprotected second substituents are left by the removal of second protective groups, 2) patternwise exposing said polymer to radiation to induce removal of a multiplicity of said first protective groups exposed to said radiation thereby forming a latent image, 3) developing said latent image to form a pattern, and 4) employing said pattern as a mask, for subsequent device processing, wherein a multiplicity of said second protective groups are removed to leave said multiplicity of unprotected second substituents before said exposure and wherein said second protective groups have a different chemical substituent which has a chemical property different from said first protective groups allowing said removal of said second protective groups without substantially affecting said first protective groups.

2. The process of claim 1 wherein said second protective group is chosen from the group consisting of trimethylsilyl, triethylsilyl, dimethylsilyl, dimethylpropylsilyl, dimethylisopropylsilyl, and dimethyl-t-butylsilyl.

3. The process of claim 2 wherein said first protective group is a t-butoxycarbonyl group.

4. The process of claim 1 wherein said first protective group is a t-butoxycarbonyl group.

5. The process of claim 1 wherein said polymer includes pendant phenyl rings.

6. The process of claim 5 wherein said phenyl ring is meta substituted with said first or said second protective group.

7. The process of claim 1 wherein said second protective groups are removed before said applying to a device substrate.

8. The process of claim 1 wherein said second protective groups are removed after said applying to a device substrate.

* * * * *